United States Patent [19]

Roberts

[11] 4,418,429
[45] Nov. 29, 1983

[54] MIXER FOR USE IN A MICROWAVE SYSTEM

[75] Inventor: Clayton R. Roberts, Syracuse, N.Y.

[73] Assignee: General Electric Company, Syracuse, N.Y.

[21] Appl. No.: 375,816

[22] Filed: May 7, 1982

[51] Int. Cl.³ .............................................. H04B 1/26
[52] U.S. Cl. .................................. 455/327; 455/328; 455/330
[58] Field of Search ............................. 455/325–328, 455/330

[56] References Cited

U.S. PATENT DOCUMENTS 3,943,450 3/1976 Otremba .............................. 455/327
4,000,469 12/1976 McMaster .......................... 455/327
4,348,773 9/1982 Caroli ................................. 455/330

FOREIGN PATENT DOCUMENTS 2816915 11/1978 Fed. Rep. of Germany ...... 455/328

OTHER PUBLICATIONS

"A 20-GHz Integrated Balanced Mixer" by Araki et al., Jul. 1971.

Primary Examiner—Jin F. Ng
Attorney, Agent, or Firm—Richard V. Lang; Carl W. Baker

[57] ABSTRACT

The present invention relates to a mixer for use at high microwave frequencies (typically 21.8×23.2 GHz) in a low cost communications application. The invention utilizes low cost microwave components, including a low cost compartmented waveguide, shared by the signal and local oscillator and extensive microstrip circuitry. The provision of a pair of novel ¼ wave impedance transformers coupled into the waveguide compartments provides efficient antenna and local oscillator input filtering, and efficient coupling from the waveguide sections to the microstrip circuitry. The mixer operation is carried out in the microstrip circuitry, which contains a hybrid coupler, a balanced diode detector, and the required mixer output filter. The arrangement is of low cost, and provides a low noise figure (7 db including the preamplifier), good band selectivity (15 db return loss over the communications band), and low local oscillator radiation.

15 Claims, 5 Drawing Figures

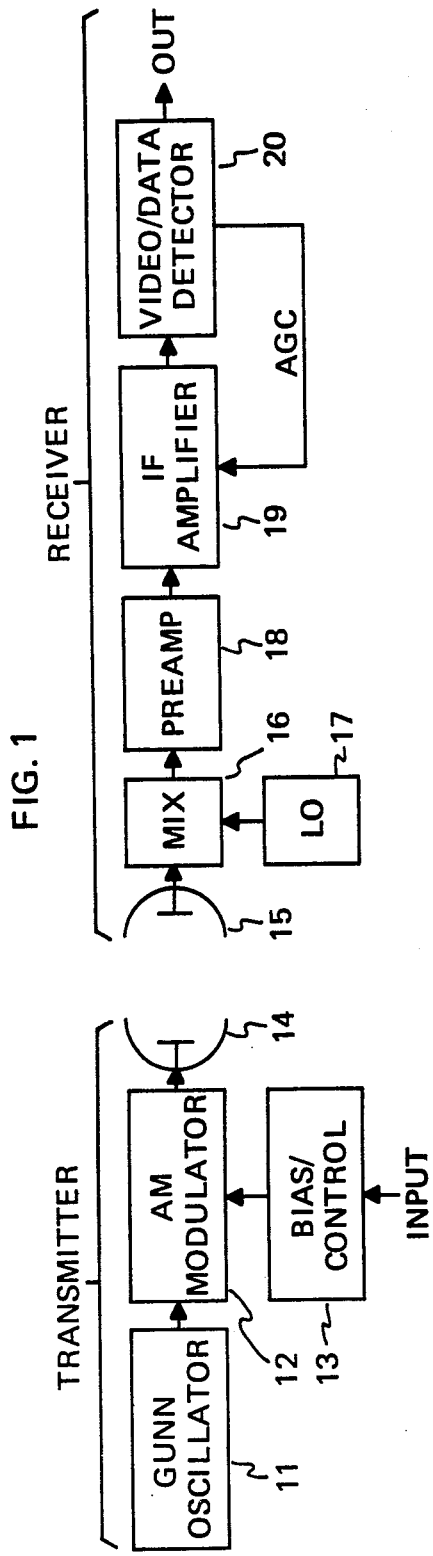
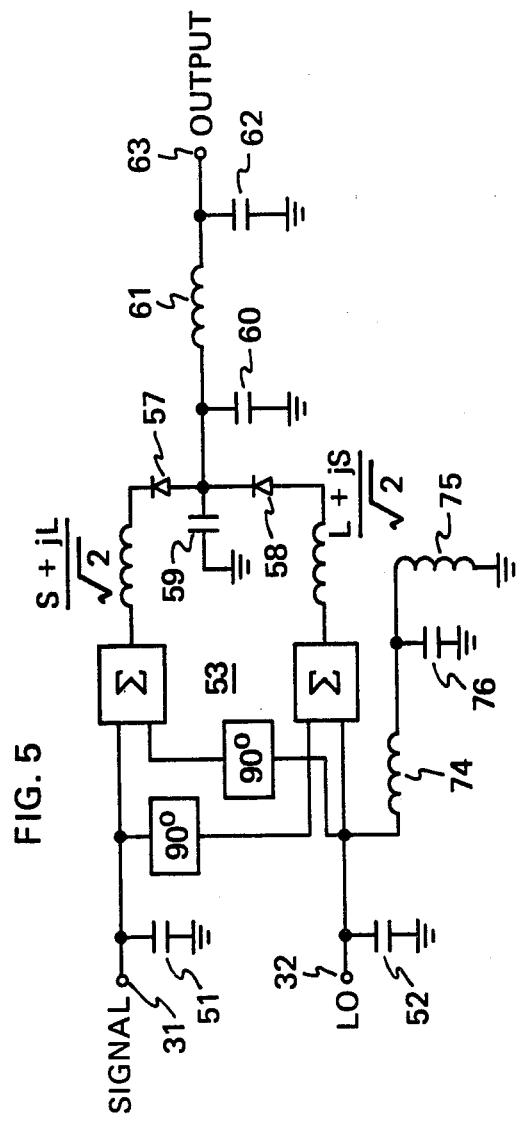

MIXER FOR USE IN A MICROWAVE SYSTEM

BACKGROUND OF THE INVENTION

1. Field of the Invention

The present invention relates to microwave systems, typically communications systems, such as find use in the communications band of 21.8 to 23.2 GHz carrier frequency. The invention further relates to a novel mixer for effecting a stable, low cost, single conversion of a microwave signal to an intermediate frequency suitably low (50 MHz) for convenient amplification. In a mixer operating at these disparate frequencies, efficient transmission paths and efficient filtering must be provided. The disclosed transmission paths include waveguides, microstrip circuits, transitions between waveguide and microstrip circuits, and suitable filters connected before and after the mixer.

2. Description of the Prior Art

A need has arisen for broadband, short range, low cost and generally directional point to point communications channels. Typically, such channels require adequate bandwidths for television channel capability or for wideband data transmission suited for computer applications. Higher microwave frequencies, i.e., "K" band, are now acessible with the advent of relatively low cost Gunn diode oscillators. (These currently operate up to about 30 GHz.) The Gunn diode oscillator provides both a low cost source of modulatable RF energy for low power signal transmission, and a low cost local oscillator for use in the signal conversion process. The Gunn diode oscillator is of a highly stable design, and permits use of relatively low IF frequencies, usually without the need for a closed loop frequency control. Thus, a simple, single conversion system is practical. Low cost dish antennas and efficient antenna waveguide feeds are well known (see Sichak article infra). In addition, low cost, high frequency diodes are available and packaged suitably for use as balanced mixers at these frequencies. In the mixer design, however, the question arises as to the most efficient and most economical method of providing the essential filtering and of providing the essential signal transmission paths. It is at this point that the use of microstrip circuits is suggested. Known microstrip circuits provide low cost construction of transmission paths, hybrid couplers, and filter circuits. These developments find application to the present invention.

SUMMARY OF THE INVENTION

Accordingly, it is an object of the invention to provide an improved mixer for high frequency operation.

It is another object of the invention to provide an improved mixer for microwave operation.

It is a further object of the invention to provide an improved single conversion mixer for microwave operation.

It is an additional object of the invention to provide a single conversion mixer for microwave operation having improved input and output transmission paths.

It is another object of the invention to provide a single conversion mixer for microwave operation having improved filtering in the input and output transmission paths.

It is still another object of the invention to provide an improved single conversion mixer employing microstrip transmission paths efficiently fed from sources coupled by waveguides.

These and other objects of the invention are achieved in a novel mixer comprising waveguide means, a local oscillator and signal coupling means, both coupled to the waveguide means, a microstrip circuit, in which balanced detection occurs, and a pair of impedance transformers for deriving local oscillator and signal energy from the waveguide means and coupling it efficiently to the microstrip circuit.

More particularly, the waveguide means propagates waves in a TE 10 mode and contains an electrically shorted, transverse wall, which divides the waveguide means into two electrically isolated waveguide sections. The local oscillator couples high frequency energy into the first waveguide section and the signal (usually from an antenna) is coupled into the second waveguide section.

The microstrip circuit, in which detection occurs, comprises a ground plane, a thin dielectric layer, and surface conductors formed on the dielectric layer. The microstrip circuit further comprises a four-port hybrid coupler formed of surface conductors; a balanced detector comprising a pair of diodes, each having one electrode connected via a surface conductor to one hybrid coupler output port, the other diode electrodes being joined and connected to a surface conductor at which the detector output, containing heterodynes appears; and a low pass filter formed of surface conductors, and connected to the detector output for selecting the desired low frequency heterodyne and rejecting the undesired higher frequency heterodynes.

The microstrip circuit is disposed adjacent a wide face of the waveguide means in proximity to the transverse wall for convenient interconnection. More particularly, the filter impedance transformer is formed from a first resonant stub of approximately ¼ electrical wavelength projecting through an aperture in the wide face of the waveguide into the interior thereof for deriving local oscillator energy present in the first waveguide section and for supplying it to one input port of the hybrid coupler.

The second impedance transformer is formed from a second resonant stub also of approximately ¼ electrical wavelength projecting through an aperture in the wide face of the waveguide into the interior thereof for deriving the signal energy present in the second waveguide section and for applying it to the other input port of the hybrid coupler. The two stubs form effective impedance transformers for matching the impedance of the waveguide section to the impedance of the hybrid coupler input ports.

Preferably, the frequency of the local oscillator and the signal are selected to be sufficiently close such that the transverse dimensions of the two waveguide sections may be the same without causing a non-TE 1-0 mode of the propagation; the frequency selection should also permit the hybrid to accommodate both frequencies without a broadbanded design; and the frequency difference should produce an IF frequency sufficiently low for convenient solid state amplification. Typical frequency differences in the 23 GHz communication band permit an intermediate frequency of 50 MHz.

In accordance with another facet of the invention, the axes of the resonant stubs are oriented perpendicular to the wide faces of the waveguide and are spaced from the transverse wall by amounts adequate to provide efficient transfer of microwave energy from the waveguide section into the stub with the inner end of the stub being spaced from the lower inner surface of the waveguide to avoid shorting the electrical field. An insulator having a substantial dielectric constant is provided encircling each stub for increasing the electrical length of the stub to approximately ¼ wavelength to provide an approximate match of the impedance of the waveguide section (at the position of the probe) to the characteristic impedance of the associated hybrid input port on the microstrip circuit.

For maximum selectivity, which conveniently embraces a band having approximately 6% relative bandwidth (e.g. 21.8 GHZ to 23.2 GHz), the axes of the stub are placed approximately ⅛ electrical wavelength from the transverse wall in the waveguide and on the center line of the waveguide section. This placement also allows for efficient energy transfer from each waveguide section into the microstrip circuit.

For optimum tuning, the electrical lengths of the stubs are set slightly in excess of ¼ electrical wavelength to produce a net inductive effect, and an additional capacitance is provided at each of the hybrid coupler input ports to optimize the energy transfer.

In addition, the two surface conductors, each of which is connected between a hybrid coupler output port and a detector diode, are made of equal electrical length for effecting cancellation of local oscillator noise at the detecgtor output. For impedance matching the hybrid coupler output ports to the detector diodes, which are of lower impedance, each detector connected surface conductor is thinned to present an effective serial inductance. To complete the matching network a shunt capacitance is provided at the detector output.

The low pass detector output filter is a pi network consisting of an input shunt capacitance, a serial inductance, and an output capacitance. The low pass filter is connected to the diode output by a ¼ wavelength line segment, the disposition causing the filter input capacitance to be reflected back to the diode output for the dual use thereof.

Preferably, the microstrip circuit uses conductors which form transmission paths having a characteristic impedance in the vicinity of 50 ohms. For instance, the serial branches of the hybrid coupler have characteristic impedances of approximately 35 ohms, the shunt branches of the hybrid coupler have characteristic impedances of approximately 50 ohms, and the hybrid coupler ports have characteristic impedances of 50 ohms. In addition, the ¼ wavelength line segment from the detector output to the low pass filter, both filter input and filter output double stubs and the signal path from the low pass filter have characteristic impedances of approximately 50 ohms. This impedance choice provides for efficient signal transfer at microwave frequencies.

The mixer is typically constructed of three rectangular waveguide sections interconnected by mating flanges.

BRIEF DESCRIPTION OF THE DRAWINGS

The novel and distinctive features of the invention are set forth in the claims of the present application. The invention itself, however, together with further objects and advantages thereof, may best be understood by reference to the following description and accompanying drawings in which:

FIG. 1 is a block diagram of a 23 GHz microwave communication system employing a novel mixer constructed in accordance with the present invention;

FIG. 5 is an electrical equivalent circuit representation of the microstrip circuit of FIG. 4.

DESCRIPTION OF THE PREFERRED EMBODIMENT

Figure 2:
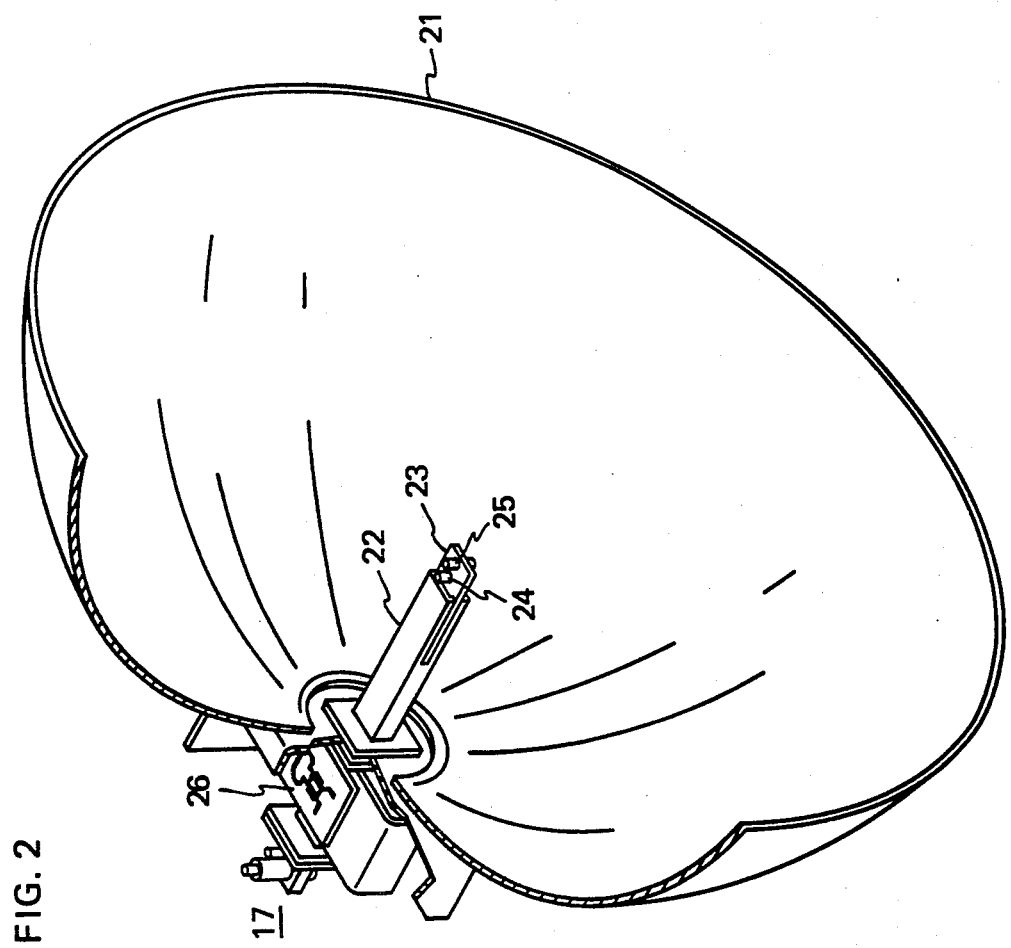
FIG. 2 is a cut-away perspective view of a receiving installation of the FIG. 1 communication system.

Referring now to FIG. 1, there is shown a block diagram of a 23 GHz microwve communication system employing a novel mixer, which is the subject of the present invention. The communication system comprises a transmitter portion driving a transmitting antenna and a receiver portion coupled to a receiving antenna, the latter arranged to receive transmissions from the transmitting antenna.

More particularly, the transmitter comprises a high frequency oscillator 11, typically a Gunn oscillator, which is subject to amplitude modulation in the AM modulator 12, the modulations being applied from a bias control unit 13. The output of the AM modulator 12 is coupled to the transmitting antenna 14. Typically, the Gunn oscillator 11 operates at a power level of 100 milliwatts and the antenna takes the form of a small parabolic, dish antenna, slightly under 12" in diameter. The modulator 12 is a pin diode modulator installed in a waveguide, not illustrated, interconnecting the Gunn oscillator to the antenna 14. The blocks 11, 12 and 13 are of conventional design.

The antenna 14 is similar to that illustrated in FIG. 2 and is driven by the waveguide end remote from the Gunn oscillator. The waveguide feed is split by a flat conductive member lying in a plane parallel to the upper and lower surfaces of the waveguide, the conductor being used to support an inner active dipole, which is fed by the waveguide, and an outer reflective dipole. The second dipole is used as a reflector at the termination to reduce the back lobe of the feed and thus increase the efficiency of the antenna. The back lobe can be further reduced by tapering the thickness of the waveguide. This refinement was not required in the present design. The double dipole antenna (with the tapering feature) is described in the Rad Lab Series Vol. 12, "Microwave Antenna Theory and Design", Section 8.9, Double-Dipole Feeds, b Waveguide System. The waveguide double-dipole feed is shown in Figure 8.14. A footnote to that figure cites RL Report No. 54-25, June 26, 1943, W. Sichak, "Double Dipole Rectangular Waveguide Antennas". In FIG. 2, which shows the receiving installation, the waveguide is shown at 22, the dipole mounting strip is shown at 23, the active dipole is shown at 24 and the reflective dipole is shown at 25.

Recapitulating, the energy developed from the Gunn oscillator 11 and then modulated by the AM modulator 12 is coupled via the waveguide to the antenna feed, which by means of the parabolic antenna 14 develops a focused beam. In the present practical embodiment, the input for the AM modulator may take the form of video information or digital information. As will be seen, the useful bandwidth of the communication system is approximately 15 MHz.

The receiving system includes a receiving antenna 15, similar in design to that of the transmitting antenna and is the antenna specifically illustrated in FIG. 2. Similar to the transmitting antenna, the receiving antenna 15 consists of a parabolic dish 21 feeding the waveguide 22 by means of the short reflective dipole 25 arranged outwardly of the active dipole 24. In reception, waves are collected from the surface of the dish 21, and focused upon the reflective dipole 25. The latter reflects the signal to the active dipole 24, which feeds vertically polarized signal energy into the waveguide 22 directed inwardly toward the novel mixer 26.

The receiver portion further includes the local oscillator 17, which in cooperation with the mixer 16 converts the received signal at a 50 MHz IF frequency. As will be described, the converter has both input and output bandpass filtering. The signal at IF frequency is then amplified in the preamplifier 18, optimally additionally filtered at the IF amplifier 19, and finally amplified to a level suitable for detection in the video data detector 20.

If the information is video information, for example in the form of a television picture, the signal is applied to a suitable monitor, not shown, In the event that the information supplied is digital information for computation, the output of the detector 20 is coupled to the input of a processor and then a computer.

The communication system is designed for a low cost market. The dish antenna and associated electronics being housed in a conventional large signal light housing, with a thin plastic enclosure protecting the antenna from exposure to the weather. The antenna is linearly polarized and has a radiating angle at 23 GHz of about 2.5° and a gain of 34 db. At the indicated 100 mw power levels, the microwave communication sytem provides "all weather" communication in a line of sight for up to about 5 miles.

In the interests of cost reduction, the mixer achieves single conversion from 23 GHz to a 50 MHz IF frequency. Single conversion is feasible since FCC channel allocations in this band minimize the image problem, (alternate channel usage avoiding the image). Single conversion intrinsically leads to reduced cost of conversion. In addition, the mixer would be costly if constructed using both a waveguide input and waveguide output. As will be seen, the present approach of using a waveguide for the high 23 GHz input frequency and microstrip circuitry at the mixer, provides a lower cost solution by a factor of 10 than an all waveguide solution. The novel balanced mixer design achieves reduced local oscillator radiation at the antenna and produces a reduced noise figure for the mixer.

Figure 3:
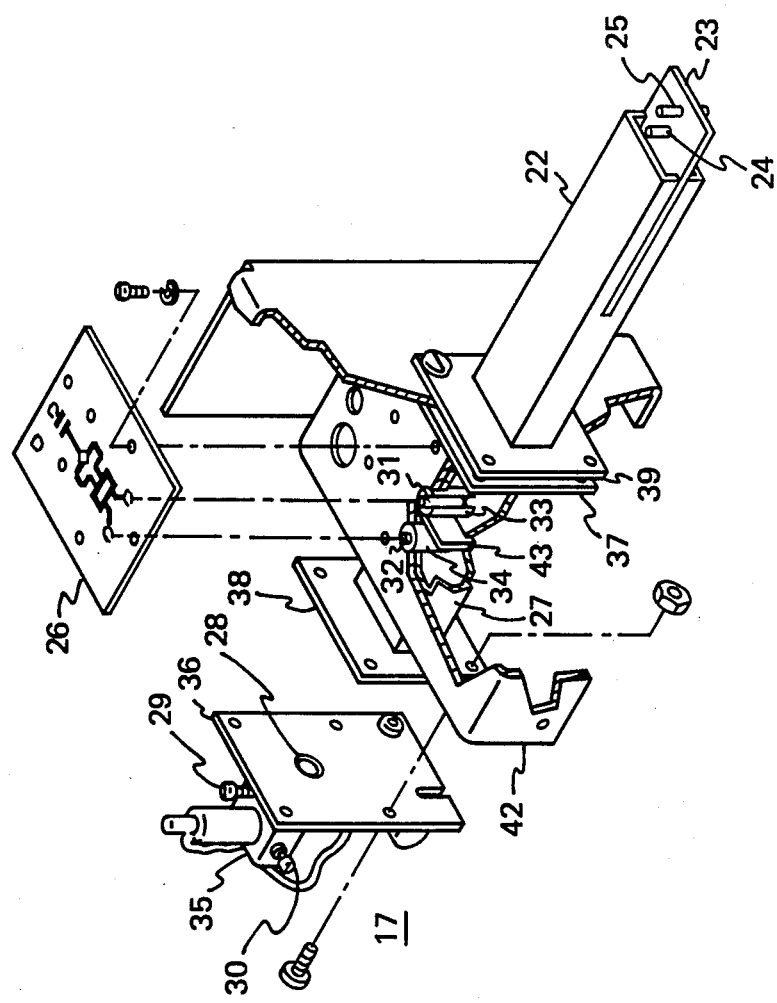
FIG. 3 is a more detailed perspective view of the receiving installation, illustrating the mechanical details of a novel mixer employing microstrip transmission paths and including the waveguide microstrip circuit interconnections.
Figure 4:
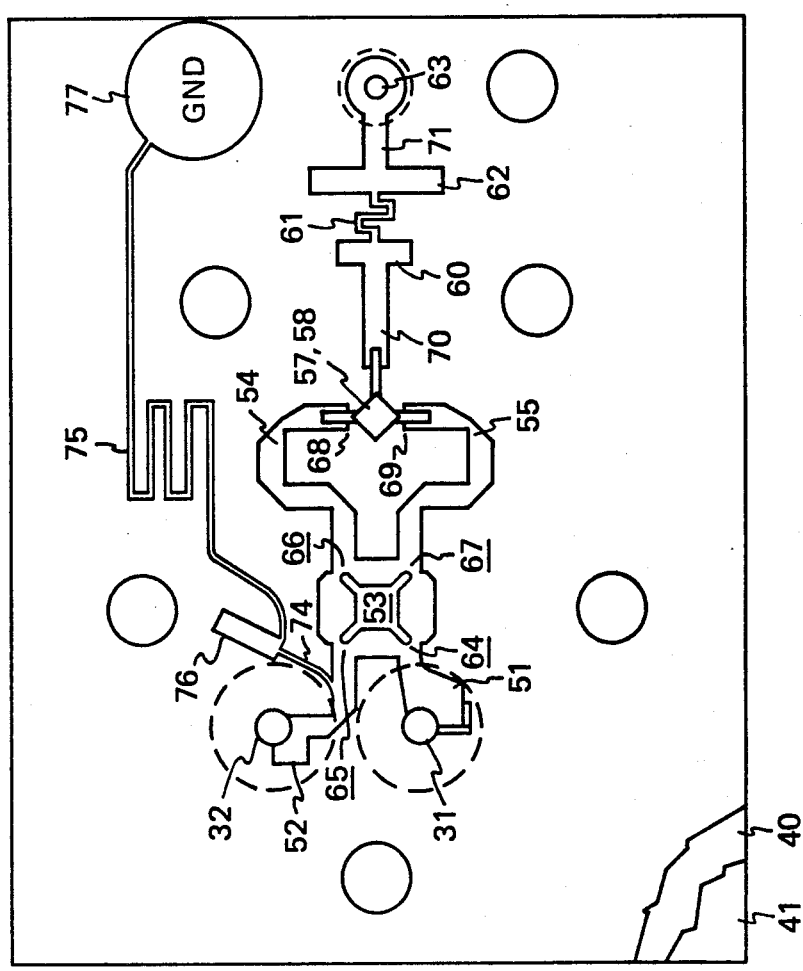
FIG. 4 is a detailed plan view of the microstrip circuit in which mixing occurs.

The mixer 16 and its components are shown in FIGS. 2, 3, 4 and the equivalent circuit diagram is shown in FIG. 5. FIG. 2 is a mechanical drawing showing the principal external parts of the mixer, which include the waveguide 22, the local oscillator 17 and the microstrip circuit 26 in which the actual frequency conversion or mixing takes place. The same elements are shown in greater detail in FIG. 3, the view being broken open and exploded for improved clarity.

FIG. 4 is a detailed plan view of the microstrip circuit 26. FIG. 5, the equivalent circuit diagram of the mixer, commences at the point where the signal at 23 GHz is derived from the waveguide and introduced to the microstrip circuit and continues to the point where the low frequency signal at IF frequency (50 MHz) is transferred from the microstrip circuit to the video preamplifier 18. The explanation will now proceed with reference to FIGS. 2-5.

As best seen in FIG. 3, the waveguide structure is a three part assembly (22, 27, 35) fastened together by mounting flanges. The antenna elements 23, 24, 25 are supported on the right end of the waveguide 22 (using the orientations of FIG. 3), the right flange 39 of which fastens to the left flange 37 of a central waveguide member 27. The antenna is vertically polarized, with the received wave (TE 10) being directed to the left into the waveguide 22 toward the waveguide member 27. The local oscillator 17, a Gunn oscillator, also includes a flanged waveguide section 35, the flange 36 of which is mounted on the left flange 38 of the waveguide member 27. As seen in FIG. 3, a small orifice 28 is provided in the flange 36 to couple local oscillations into the left opening of the waveguide 27. The Gunn oscillator has screw adjustments, i.e., 29, 30, which permit it to be precisely tuned to a selected channel in the 23 GHz band. The approximate frequency setting is determined by the interior dimensions of the "cavity" formed by the waveguide section 35. The length of the waveguide section 35 is approximately 1 wavelength long. The Gunn diode, which acts as a dc energized, negative resistance diode oscillator, is electrically connected between the top and bottom surface of the waveguide section at approximately $\frac{1}{4}$ wavelength from the back (leftmost) interior surface. The tuning screw 29 is approximately $\frac{3}{4}$ wavelength from the back interior surface of the cavity. The arrangement generates a vertically polarized wave (TE 10), which is coupled through the orifice 28 into the left opening of the waveguide member 27. The orifice 28 allows sufficient decoupling (typically, the coupling coefficient is 10-15%) between th oscillator and the central waveguide load for oscillator frequency stability.

The central waveguide 27, which receives signals from the antenna entering the right opening and local oscillations from the Gunn oscillator entering the left opening, and thus operating in the TE 10 mode, is the means for coupling both waves into the microstrip circuit 26. As seen in FIG. 3, the waveguide 27 has a transverse shorting partition 43 dividing the waveguide into two isolated sections, and causing backward reflections of any energy directed into the waveguide toward two conductive probes or stubs 31 and 32 arranged respectively, to the right and to the left of the central partition. The stubs 31, 32 are the means for coupling energy from the two interior regions of the waveguide 27 into the microstrip circuit 26.

The stubs are inserted into the waveguide 27 through circular openings in the top, wide-dimensioned, surface of the waveguide. The openings are sufficiently large to admit the smaller radius central conductors (31, 32) of the stubs and the two larger radius cylindrical insulators 33, 34 providing for their support. The cylinders 33, 34 extend downwardly through the waveguide openings into contact with the upper surface of the bottom of the waveguide, while the conductive probes are arranged to be spaced typically 35 mils above that upper surface of the bottom of the waveguide.

Continuing with a description of the design and placement of the probes, the waveguide 22 is a WR42 brass waveguide having an interior dimension of 0.17"×0.42" and wall thickness of 0.04". The probes 31, 32 are approximately 0.048" in diameter, and the supporting insulating cylinders are 0.160" in diameter. The assembly is installed perpendicular to the upper surface of the waveguide and substantially in contact with the central partition 43 on the center line of the waveguide.

The microstrip circuit 26 has a central insulating layer 40, 0.010" in thickness, spaced individual conductors on the upper surface, and a continuous conductive underlayer 41. The individual conductors on the upper surface of the microstrip circuit make electrical contact with the probes 31, 32 and have line widths designed for a proper impedance match to the probes. The conductive underlayer 41 is mounted in electrical contact with a bracket 42 resting on the upper surfaces of the waveguide. Adjacent the top surface of the supporting cylinders 33, 34, a circular region of the bracket 42 and of the lower conductive underlayer 41 is removed.

Mechanically, the supporting cylinders 33, 34 stabilize the probes from vibration, etc., and together with the probes 31, 32 and holes for reception of the cylinders and probes, align the waveguide 27, the support bracket 42, and the microstrip circuit 26.

The probe design influences the coupling factors required to couple energy from the waveguide sections into each microstrip input connection; the bandwidth of the coupling action; and the correct impedance transformation ratio to match the waveguide section impedance to the microstrip impedance.

The probes are positioned on the center line of the waveguide at a distance selected to minimize back reflections out of the waveguide over the pass band and in order to optimize the transfer of energy from the probe into the microstrip circuit 26 within the same pass band. The placement of the probes 31, 32 has a very significant filtering effect upon the converter. Measurements indicate that optimum placement of the probe (for greater selectivity) produces a bandpass characteristic into the microstrip over the 21.8 to 23.2 GHz communication band (approximately 6% bandwidth) generally in excess of 15 db (return loss) and in regions of maximum rejection exceeding 30 db. The return loss (into the antenna) corresponds to a VSWR of approximately 1.4 over the pass band. Outside of the pass band, the return loss is near zero. Thus, a very low loss communication band, bandpass filter with a good coupling factor into the mixer input is provided.

The axial placement of the probe in relation to the partition 43 also varies the bandwidth. The actual distance of the center line of the probe to the partition is 0.080", and is slightly in excess of ¼ electrical wavelength along the waveguide. (This provides a minimum passband design. A wider passband would be achieved by increasing the distance from the partition 43.)

In principle, each probe is a ¼ wavelength impedance transformer for matching each waveguide section to the associated microstrip input. The physical configuration prevents the actual lengths of the probes from having the desired electrical length, but this problem is overcome by the insulating cylinders 33, 34. The lower end of the probes must be spaced from the lower waveguide wall to prevent the vertical E field established in the waveguide from being shorted. The upper ends of the probes 31, 32 extend slightly above the upper surfaces of the waveguide and slightly above the upper surface of the supporting cylinders 33, 34 for an amount adequate to allow electrical contact between the upper ends of probes and conductive members on the upper surface of the microstrip circuit 26. The upper end of the probe passes through the upper surface of the waveguide 27, the mounting bracket 42, and the microstrip circuit 26. Where the probe passes through apertured walls, a virtual, short coaxial line is created having a characteristic impedance near 50 ohms, which is approximately that of the hybrid coupler input port. The inner surface of the upper wall of the waveguide, which is the point where the probe enters the virtual coaxial line, defines the upper physical limit of the probe, and due to the gap required at the lower limit, forces the probe length to be less than $\lambda/4$ in this application. The characteristic impedance of the WR42 waveguide at this frequency is approximately 480 ohms. The (vertical) E field dimension of the waveguide is $\lambda/4$ and the probe bounded as described above cannot be quite this long. The use of the dielectric supporting cylinder thus permits the electrical length of the probe to be lengthened from about 5/6 of $\lambda/4$ to somewhat over $\lambda/4$. In free space, a quarter-wave pole would exhibit an input transfer impedance of 377 ohms. This addition of the dielectric thus brings the transfer impedance somewhat past that corresponding to $\lambda/4$ length (and thus slightly inductive) and to a value somewhat less than 480 ohms. The microstrip impedance is designed to be 50–100 ohms. The slightly inductive impedance permits a small capacitance stub with a calculated $Z \approx 97\Omega(45°)$ to provide a good impedance match into the input ports of the hybrid coupler 53.

The mixing operation takes place on the microstrip circuit 26. The plan view in FIG. 4 illustrates the conductive runs on the upper surface of the microstrip circuit. An equivalent circuit representation of the electrical effect of these conductive runs is shown in FIG. 5. In summary, the microstrip circuit is seen to include matched input connections, having capacitive reactances 51, 52 for matching the probes 31, 32 to the input ports of a microwave hybrid coupler 53 represented in FIG. 3 by two summation networks (with the symbol "$\Sigma$" superimposed) and two phase shift networks (with the symbol 90° superimposed). The signals $$\frac{S + jL}{\sqrt{2}} \text{ and } \frac{L + jS}{\sqrt{2}}$$

from the output ports of the hybrid coupler are coupled via inductive impedance matching arms to the balanced detector diodes 57, 58. The hybrid coupler 53 is commonly referred to as a branch line hybrid coupler. It has four ports interconnected by four ¼ wavelength paths. The design permits 3 db power division at each of the four ports. The design is capable of being carried out in waveguide, stripline circuitry and, as herein described, in microstrip circuitry.

An equivalent capacitance 59 between the diode interconnection and ground completes the input circuit for the balanced diode detector. The detector output at 50 MHz is coupled via the $\pi$ filter 60, 61, 62 which selects the desired heterodyne frequency (50 MHz) and couples it to the output terminal 63. The necessary rf filtered, dc return path for setting the balanced diodes in the correct operating range is shown at 74, 75, 76.

The mechanical and electrical details of the microstrip circuit are best seen with reference to FIG. 4. The microstrip circuit 26 has a lowermost conductive layer 41, typically of 1 oz. copper, a 0.010" thick insulating layer 40, with a dielectric constant of 2.17, and suitable for operation at the indicated frequencies, a plurality of apertures for acceptance of the input and output signal connections and operating potentials, and a plurality of conductive runs on the upper surface of the microstrip circuit 26.

These conductive runs define the microstrip paths through the mixer and provide the necessary operating energization for the detector diodes. The line widths of the conductive runs together with the dielectric constant and dimensions of the material forming the dielectric layer, define the impedances of these lines. In order to reduce far field radiation and propagation losses, the line widths on the microstrip are selected to be approximately 50 ohms. This reduces the losses very significantly in respect to that of a 200-300 ohm microstrip line.

The signal paths on the microstrip will now be described with greater particularity. The antenna signal is coupled from the probe 31 by the widened conduction run 51 to the input port 64 of the hybrid coupler 53. The run 51 is of minimum length to reduce signal loss. The widening is dimensioned to provide a capacitance to tune the inductive driving point impedance to the nominal 50 ohms impedance of the hybrid coupler 53. The local oscillator signal from the probe 32 is similarly coupled by a widened matching strip 52 to the hybrid coupler input port 65. The exact length of the local oscillator run is not critical and is connected by a somewhat longer connection.

The hybrid coupler 53 has input ports 64, 65, and output ports 66, 67, each connected by a ¼λ branch. The series branches between ports 64, 67 and 65, 66, respectively, have 35 ohm characteristic impedances (they are wider). The shunt branches between ports 64, 65 and 66, 67 respectively, have 50 ohm characteristic impedances. (They are relatively narrower than the series arms). Each corner of the hybrid coupler is notched to equalize the path length around the hybrid and to direct the waves efficiently in the widened sections. The electrical design produces the complex quantities indicated in FIG. 5 at the hybrid coupler output ports 66, 67.

The next task is to take the complex quantities available at the hybrid coupler output ports 66, 67 and couple them efficiently to the balanced detector (57, 58). The output port 66 is coupled via a first line segment 66-54, and a second line segment 54-68 to the anode of diode 57 of the balanced diode pair (57, 58). The output port 67 is similarly coupled via a first line segment 67-55 and a second line segment 55-69 to the cathode of the diode 58 of the pair. The cathode of diode 57 and the anode of diode 58 are joined and are the point from which the detected output appears. The line segments 66-54 and 67-55 have an electrical impedance of 50 ohms and are of equal electrical length. The diodes 57, 58, at 23 GHz and at a given local oscillator power level, have an impedance of about 25 ohms. (The selected local oscillator power level is 5-10 milliwatts.). The diode impedance must be matched, first regarding the diodes as the load for the hybrid coupler, and secondly regarding the diodes as the generator of the heterodyne signal supplied to the preamplifier.

The line segments 54-68 and 55-69 (which have been thinned) are a part of the matching networks required to match the detector diodes as loads to the hybrid coupler output ports 66, 67. The line segments are locally increased in impedance (both inductive and resistive) at locations just past the points 54 and 55 and which extend between ⅜λ and 7/16λ to obtain the desired series impedances.

The diode matching networks are completed by the application of an effective shunt capacitance (FIG. 5, capacitor 59) between the detector output and ground. This capcitance is obtained by use of a half-wave line segment 70 serially connected between the junction output point and the dual input matching stubs (60) of the output pi network (60, 61, 62). This choice of length for segment 70 reflects the capacitive impedance of the input stubs 60 back to the detector output. The capacitance 59 thus completes the network for matching the diodes 57, 58 to the hybrid coupler 53. The inductive impedance of each short line segment (54-68; 55-69), in series with the dynamic diode load; and the capacitance 59 and the self capacitances of the diodes 57, 58, in shunt with the diode load, form an impedance matching "L" network in which the diode loads presented to the hybrid coupler becomes essentially resisitive and properly terminated.

A second effect of the capacitance 59 is to present a low impedance to ground and thereby provide further isolation between the antenna signal and the local oscillator.

Assuming now that all of the measures indicated above to effect a proper impedance transformation into the diodes 57, 58 has taken place, the branch line hybrid coupler causes the local oscillator signal to be shifted in phase so that any noise produced by the local oscillator is cancelled at the balanced diode detector. To maximize this cancellation, the two lines coming to the diodes 57, 58 must be of identical electrical length. Reduction of the noise is critical to the noise figure of the converter and provides an approximately 3 db improvement over the figure that one would obtain using a single-ended mixing circuit.

Finally, the source impedance of the balanced diode detector is in the vicinity of 25-50 ohms at the heterodyne frequency. This source impedance provides an approximate impedance match into the output pi filter, whose input impedance is approximately 50 ohms.

As earlier noted, the diodes 57, 58 provide the detected IF signal at 50 MHz which drives the output pi network 60, 61 and 62. The diode output is coupled via the 50 ohm line segment 70 of one-half wavelength to a short double tuning stub bearing the reference numeral 60. The use of the ½ wavelength line segment 70 allows the capacitance obtained from the double tuning stub 60 to be reflected back to the diodes where it appears as the capacitance 59 in the FIG. 5 diode load circuit. It also appears as the first capacity 60 of the FIG. 4 pi network. The first double tuning stub has a line width corresponding to 50 ohms and extends above and below the center of the line segment 70 by approximately ⅛ of a wavelength. This permits a first high shunt capacitance. The serial inductive member 61 is of approximately 200 ohm line width and is approximately ¼ wavelength (at 23 GHz). This presents a large serial inductance. The second dual stub of the pi network has a line width of 50 ohms and each stub extends ⅛ wavelength above and below the center line. This presents a very high shunt capacitance and an equivalent a.c. ground at the microwave frequencies. The 50 ohm output line segment 71 couples filtered output to the output pad 63 for connection to the preamplifier.

The output pi network is designed to filter out all microwave frequencies from the detected output. As discussed, it is a pi, low pass filter of the electrical configuration shown in FIG. 5. The design eliminates the microwave components in the region of 23 GHz and above. The output impedance of the filter at 50 MHz is about 500 ohms at the IF frequency and fits the impedance of the mixer output to the input impedance of the preamplifier.

The diodes 57, 58 must be operated at a desired dynamic impedance level. For this reason, a carefully filtered dc return path for the diode is provided which is symbolically illustrated in FIG. 5 by the inductance 74, inductance 75 and the capacitance 76. As seen in FIG. 4, a high impedance ¼ wavelength line 74 is provided at the local oscillator input. It is connected to a line segment 76, which is also of ¼ wavelength (50 ohm line width). This stub configuration creates an ac short at 23 GHz, which reflected to the take-off point, becomes an infinite impedance and prevents significant ac coupling of local oscillator output into the line. The dc return continues as a high impedance 5 mil line entering a serpentine configuration which increases the self-inductance and series resistance of the line until it reaches the pad 77 to which the preamplifier is also grounded and which is the ground reference of the diode output. When the dc paths are traced, it may be seen that the diodes 57, 58 are operating at a zero dc bias. The correct dynamic impedance level is achieved by using the correct level of the local oscillator. The 5 to 10 milliwatt level achieves this objective. The balanced configuration permits both diodes (assuming they are closely matched) to be balanced. The diodes 57, 58 are beam lead supported with an 0.1 picofarad package to ground capacity. The diodes are of Schottky design (5600 Alpha Industries, Inc., Woburn, MA, 01801).

The practical embodiments of the invention so far described has been optimized for use at the 21.8 to 23.2 GHz communications band. The WR42 waveguide selected is designed to propagate waves over the frequency range of from 18 to 26.5 GHz, in a TE 10 mode. A larger waveguide, as for instance one of double size, would pose the problem of supporting spurious modes, as for instance a TE 11 mode at the same frequency. The waveguide selection, if the operating band is changed, should be scaled for restriction to the TE 10 mode of propagation.

Similarly, the microstrip circuit design must be selected in relation to the operating frequency (21.8-23.2 GHz). In general, 25 ohm lines are too wide at this frequency, and exhibit moding problems, and excessive propagation path problems. Thus, the hybrid coupler cannot ordinarily be designed to the exact dynamic impedance (25 ohms) of the detector diodes, but must be matched through a transformer. The selection of 50 ohms and 35 ohms for the hybrid coupler branches and other microstrip signal paths is practical, and in the case of the hybrid coupler, the use of corner notches permits low impedance operation while avoiding multipath effects. Had the operating frequency been lower (higher), wider (narrower) lines would have been tolerated.

The microstrip circuit selected for the present application is of 10 mil 2.17 dielectric constant material manufactured by Minnesota Mining and Manufacturing Company, Inc. The selection permits flexibility without breakage, and good electrical efficiency. In general, at the 21.8-23.2 GHz communications band, this thickness is optimum, although slightly thinner materials could be used. At lower microwave frequencies, the dielectric material may be thicker (perhaps 0.125 at 3 GHz) since the hybrid coupler may have longer lines for a given wavelength and wider conductors (also a function of the wavelength) without multipath problems.

The local oscillator frequency is selected to be close to the signal frequency: a 50 MHz difference at 22 GHz. This close frequency relation permits the heterodyne to be of a low enough frequency for efficient low cost amplification of the heterodyne. The frequency selection also permits the hybrid coupler to work efficiently without broad banding for both local oscillator and signal frequency isolation. The frequency selection also permits use of a common waveguide (27), both sections of which support the local oscillator and signal in the TE 10 mode.

While the practical embodiment so far described is optimized for the 21.8 to 23.2 GHz communications band, the general design, in which waveguide and microstrip circuits form the principal microwave conduits, can be efficiently scaled up or scaled down in frequency. The upper band limit currently available is R-band (26.5-40 GHz) and this limit is set by available low cost microwave sources. The lowermost band likely to be of value is S-band (2.60-3.95 GHz). Frequencies lower than this suggest the use of something other than waveguide for the high frequency portions of the circuit to avoid excessive costs. In other words, the invention is generally applicable to microwave frequencies by which is meant frequencies of about 1 gigahertz and higher. The range of optimum application of the invention appears to be the centimeter wave region (3-30 gigahertz) and slightly above that (30-40 gigahertz).

The noise figure of the design is 7 db of which 1½ db is assignable to the preamplifier coupled to the output 63 of the detector. The preamplifier is conveniently formed of two stages of low noise amplification such as are provided by two Plessey SL 560C low noise RF amplifiers, the two amplifiers being cascaded and followed by bandpass filters. The arrangement provides 30 db of gain and available filters permit 80 db skirts with a 50 MHz center frequency and a signal bandwidth with a 50 MHz center frequency and a signal bandwidth of ±25 MHz.

The probes 31, 32 are of standard 0.050" (nominal) diameter (0.048" actual), and were selected because of their availability. The insulators 51, 52 are also of standard diameter 0.80" and available at low cost. The probe and insulator diameters affect the tuning of the ¼ resonant stub, and the matching between waveguide and hybrid coupler. The total design permits use of these arbitrary sizes, and in particular the positioning of the probe and the size of the capacitances 51, 52 give that flexibility. The capacitance of particular can be dimensioned in the etching of the microstrip surface conductor to have the desired exact value.

What is claimed is:
1. A mixer comprising:
A. waveguide means for propagating waves in a TE 10 mode, comprising:
 (1) two electrically isolated waveguide sections, each having an electrically shorted transverse end wall;
 (2) a first mating end associated with the first waveguide section; and
 (3) a second mating end associated with the second waveguide section;
B. a local oscillator for coupling high frequency energy into said first waveguide section via said first mating end;

C. means for coupling a signal into said second waveguide section via said second mating end to be heterodyned with local oscillator energy;

D. a microstrip circuit comprising a ground plane, a dielectric layer, and surface conductors formed on said dielectric layer, said microstrip circuit further comprising:
   (1) a four-port hybrid coupler formed of surface conductors having two serial branches and two shunt branches,
   (2) a balanced detector comprising a pair of diodes, each having one electrode connected via a surface conductor to one hybrid coupler output port, the other diode electrodes being joined and connected to a surface conductor at which the detector output, containing heterodyned signals appear, and
   (3) a low pass filter formed of surface conductors, and connected to the detector output for selecting the desired low frequency heterodyne and rejecting undesired higher frequency heterodynes;

said microstrip circuit being disposed adjacent the wide face of said second waveguide section in proximity to the transverse end wall thereof;

E. a first resonant stub of approximately ¼ electrical wavelength projecting through an aperture in the wide face of said first waveguide section into the interior thereof for coupling local oscillator energy from said first waveguide section to one input port of said hybrid coupler, the stub forming an effective impedance transformer for matching the impedance of said first waveguide section to the impedance of said one hybrid coupler input port;

F. a second resonant stub of approximately ¼ electrical wavelength projecting through an aperture in said wide face of said second waveguide section into the interior thereof for coupling signal energy from said second waveguide section to said other input port of said hybrid coupler, the stub forming an effective impedance transformer for matching the impedance of said second waveguide section to the impedance of the other said hybrid coupler input port.

2. A mixer as set forth in claim 1 wherein the frequency of the local oscillator and the signal are selected to be sufficiently close such that the transverse dimensions of said two waveguide sections may be the same without causing a non-TE 10 mode of propagation; such that said hybrid coupler will accommodate both frequencies without a broadband design, and such that the frequency difference produces an IF frequency sufficiently low for convenient solid state amplification.

3. A mixer as set forth in claim 1 wherein said two waveguide sections of said waveguide means have their wide faces in the same plane, have identical transverse dimensions, and exhibit substantially equal impedances to waves of local oscillator and signal frequencies.

4. A mixer as set forth in claim 3 wherein the axis of said first and second resonant stubs are oriented perpendicular to the wide faces of said waveguide means and are spaced from said transverse end walls by amounts adequate to provide efficient transfer of microwave energy from said waveguide sections into said stubs;

the inner end of each stub being spaced from the lower inner surface of said waveguide section to avoid shorting the electrical field; and wherein an insulator having a substantial dielectric constant is provided encircling each stub for increasing the electrical length thereof to approximately ¼ wavelength to provide an approximate match of the impedance of the associated waveguide section at the position of the probe to the characteristic impedance of the associated hybrid input port.

5. A mixer as in claim 4 wherein:
the axes of said stubs are placed approximately ⅛ electrical wavelength from said transverse end walls and on the center line of the waveguide section for efficient energy transfer from the associated waveguide section into the associated hybrid input port and for maximum selectivity over a desired band.

6. A mixer as in claim 4 wherein:
the electrical lengths of said stubs are slightly in excess of ¼ electrical wavelength to produce a net inductive effect, and wherein an additional capacitance is provided at each of said hybrid coupler input ports to optimize the energy transfer from said waveguide section via said stub transformers into said hybrid coupler input ports.

7. A mixer as in claim 6 wherein:
the two surface conductors, each of which are connected between a hybrid coupler output port and a detector diode, are of equal electrical length for effecting cancellation of local oscillator noise at the detector output.

8. A mixer as in claim 7 wherein:
each detector connected surface conductor is thinned to present an effective serial inductance, and a shunt capacitance is provided at the detector output to match the diode impedance to the impedance of the associated hybrid coupler output port.

9. A mixer as in claim 8 wherein:
said low pass filter is a pi network consisting of an input shunt capacitance, a serial inductance, and an output shunt capacitance, and wherein said low pass filter is connected to said diode output by a ½ wavelength line segment, for reflecting the filter input capacitance back to said diode output for the dual use thereof.

10. A mixer as in claim 9 wherein:
the input shunt capacitance is provided by a double stub, each stub being ⅛ electrical wavelength; the series inductance is provided by a high impedance line of ¼ electrical wavelength and the output shunt capacitance is provided by a double stub, each stub being of ¼ electrical wavelength.

11. A mixer as in claim 10 wherein in said ½ wavelength line segment from said detector output to said low pass filter, both filter input and filter output double stubs and the output signal path from said low pass filter have characteristic impedances of approximately 50 ohms.

12. A mixer as set forth in claim 11 wherein notches are provided on the inner corners of said hybrid coupler at said ports to equalize the path length around the coupler and direct the waves efficiently in the branches.

13. A mixer for use at microwave frequencies as in claim 1 wherein said surface conductors of said microstrip circuit form transmission paths having a characteristic impedance in the vicinity of 50 ohms.

14. A mixer as in claim 13 wherein the serial branches of said hybrid coupler have characteristic impedances of approximately 35 ohms, the shunt branches of said hybrid have characteristic impedances of approximately 50 ohms and connections to said hybrid ports have characteristic impedances of approximately 50 ohms.

15. A mixer as in claim 1 wherein:
A. said waveguide means is a single, rectangular waveguide, having a first and a second mating flange, and having a single electrically shorted transverse wall for dividing the waveguide means into two electrically isolated waveguide sections;
B. said local oscillator has a cavity formed from a waveguide section and is attached to said first flange; and wherein
C. said signal coupling means is an antenna fed waveguide, which is attached to said second flange.

* * * * *